United States Patent [19]

Akins et al.

[11] Patent Number: 4,817,612
[45] Date of Patent: Apr. 4, 1989

[54] CROSS-COUPLED DOUBLE LOOP RECEIVER COIL FOR NMR IMAGING OF CARDIAC AND THORACO-ABDOMINAL REGIONS OF THE HUMAN BODY

[75] Inventors: E. William Akins; Jeffrey R. Fitzsimmons, both of Gainesville, Fla.

[73] Assignee: University of Florida, Gainesville, Fla.

[21] Appl. No.: 196,780

[22] Filed: May 18, 1988

Related U.S. Application Data

[63] Continuation of Ser. No. 896,234, Aug. 14, 1983, abandoned.

[51] Int. Cl.$^4$ .............................................. A61B 5/05
[52] U.S. Cl. ..................................... 128/653; 324/318
[58] Field of Search ................................... 128/1.3–1.5, 128/653, 804; 324/307, 309, 318–320, 322; 335/299; 343/741, 742, 744, 800, 866, 867

[56] References Cited

U.S. PATENT DOCUMENTS

| | | | |
|---|---|---|---|
| 3,582,779 | 6/1971 | Bloom | 324/320 |
| 3,973,263 | 8/1976 | Green | 343/744 |
| 4,135,184 | 1/1979 | Pruzick | 343/867 |
| 4,450,408 | 5/1984 | Tiemann | 324/309 |
| 4,471,306 | 9/1984 | Edelstein et al. | 324/309 |
| 4,475,084 | 10/1984 | Moore et al. | 324/309 |
| 4,501,265 | 2/1985 | Pescatore | 128/1.5 |
| 4,547,776 | 10/1985 | Bolt, Jr. et al. | 343/741 |
| 4,602,234 | 7/1986 | Butson | 324/320 |

FOREIGN PATENT DOCUMENTS

| | | | |
|---|---|---|---|
| 3347597 | 7/1985 | Fed. Rep. of Germany | 128/653 |
| 0187839 | 11/1983 | Japan | 128/653 |
| 2149124 | 6/1985 | United Kingdom | 324/318 |

Primary Examiner—Ruth Smith
Attorney, Agent, or Firm—Dennis P. Clarke

[57] ABSTRACT

An RF receiver coil structure for NMR imaging of cardiac and thoraco-abdominal regions of a human body. The coil structure includes a coil of generally solenoidal geometry having two turns separated by an inter-element gap. The inter-element gap is sufficiently large to accommodate an average human torso at the chest level (e.g. 25 cm). The turns are cross coupled by a pair of crossed diagonal elements. The coil is formed of a tubular conductor, having a tubular diameter (outside diameter) of approximately ½ inch. The coil has terminal ends in one of its diagonal elements, and the coil structure further includes a component unit located where the diagonal elements cross. The component unit includes a capacitor electrically connected to the coil to form a parallel resonant circuit. The same geometry may be employed in a multi-turn structure, where preferably one-half of the total number of turns are positioned above the patient, and the other half below the patient.

6 Claims, 2 Drawing Sheets

CROSS-COUPLED DOUBLE LOOP RECEIVER COIL FOR NMR IMAGING OF CARDIAC AND THORACO-ABDOMINAL REGIONS OF THE HUMAN BODY

This is a continuation of application Ser. No. 896,234, filed Aug. 14, 1983, now abandoned.

BACKGROUND OF THE INVENTION

The present invention relates generally to nuclear magnetic resonance (NMR) imaging apparatus and, more specifically, to high performance receiver coils for NMR imaging of cardiac and thoraco-abdominal regions of a human body. The invention is particular relates to RF receiver coils which permit high quality imaging of the human heart.

Nuclear magnetic resonance (NMR) imaging is a known technique for obtaining cross sectional images through desired portions of a human body without exposing a patient to ionizing radiation. Briefly, the patient is placed in a static magnetic field which causes magnetic dipoles of atomic nuclei with spin (for example, hydrogen nuclei) to orient themselves with the magnetic lines of force. Like a spinning gyroscope, the spinning nuclei tend to precess with a certain angular frequency, known as the Larmor frequency. By means of a transmitter coil a radio frequency pulse is applied at a frequency which matches the natural precessional frequency. This causes the magnetic dipoles to quickly precess, while absorbing energy. When the excitation pulse ends, the nuclei briefly emit an RF signal known as the free induction signal or free induction decay. The magnetization vector of the nuclei eventually returns to its original position. This emitted RF energy can be detected by inductive coupling to a receiver coil and analyzed in view of the nature of the excitation pulse to build a set of data from which images can be constructed.

It will be understood and appreciated that the present invention is not directed to any of the various techniques for defining the cross sections for which images are constructed (e.g. phase encoding) and the techniques for actually constructing the images. Rather, the present invention assumes the existence of these known techniques. In general, the present invention is concerned with efficiently receiving the emitted RF energy from a region of the body in bulk to provide a signal suitable for analysis.

It is possible for a single coil to serve the transmitter and receiver functions. However, for optimum performance it is desirable to provide separate transmitter and receiver coils due to different design considerations.

For example, the transmitter coil should be large, have good RF homogeneity, and relatively low Q to provide broadband excitation.

The receiver coil, however, should be as small as possible consistent with the region of interest, have a reasonable amount of RF homogeneity, have a high Q (narrow bandwidth), be minimally sensitive to dielectric loading, be comfortable for the patient, and be easy to use so as to provide the minimum connection and set-up time. An RF receiver coil should maximize flux coupling from the patient to the coil surface, and at the same time, in order to prevent damage to the associated preamplifier, be reasonably orthogonal to the transmitter coil so as to minimize coupling between the two coils, and should also function in a plane perpendicular to the main (static) magnetic field.

One important performance criterion of a tuned receiver coil is the signal-to-noise ratio (SNR) which can be obtained. In theory, SNR can be calculated by formula based on the frequency, the magnetic field due to a unit current in the coil, sample volume, loaded circuit Q, filling factor, and resistive loss due to coil impedance. The first three of these variables are easily determined, but the others are not.

Theoretical analysis is limited by several factors. First, it is difficult to mathematically determine the ideal coil geometry for each organ of interest, giving rise to a large number of possible shapes. Even simple application of Faraday's law of induction may be inappropriate. For example, a multiple turn solenoid may be no better than a single turn solenoid of the same diameter when loaded with a biological sample. Electrical performance criteria such as coil Q may become irrelevant when comparing different coil geometries since Q is simply the ratio of inductive reactance to coil resistance, and in appropriate geometries may have good Qs.

The magnetic field strength of an NMR system is a fundamental determinant of magnetic resonance signal intensity. Although capable of providing diagnostic data for a broad spectrum of disease states, resistive magnet systems have suffered reduced signal-to-noise ratio (SNR) due to magnetic field strength limitations. Improved SNR can be obtained in these systems by reducing machine noise and optimizing the receiver portion of the system. Unique coil designs have facilitated high resolution studies of the central nervous system, extremities, and head and neck regions. The use of various unique coils has allowed narrowing of slices and decreased pixel size using higher field gradients. The size and location of such regions facilitates imaging by conventional surface coils, as well as full and half-saddle coils.

Imaging of cardiac and thoraco-abdominal areas has however usually depended on the use of volume coils (filling factor >50%), relatively large in size. Previous volume coils could not equal the spatial resolution possible using the surface coils (filling factor <50%) because of inherently greater signal loss from large coils. Large coils suffer loss of signal because they require greater lengths of conductor, and tend to couple to their environment (gradient coils, the magnet assembly, and the like). The most severe loss is incurred by the presence of the whole human torso, which may be approximated by a large conductive cylinder. Eddy currents in the body absorb energy from the resonant circuit, resulting in a less efficient receiver coil (lower Q). This leads to reduced currents in the coil and a lower SNR. Further, with large coils there is a phenomenon of spatial aliasing seen along the phase encoding direction when image field of view is reduced.

Flat surface coils have been used to improve resolution of abdominal structures; however, some of the images produced have been limited due to poor deep penetration which precluded optimal evaluation of all tissue within the slice. These flat surface coils were often used after volume coils had screened the area at lower levels of resolution. Thus, imaging time was increased due to repeat acquisition and coil changing time.

In summary, during the course of NMR imaging, energy is inductively coupled from the patient to an RF receiver coil, where the emf induced in the coil and therefore the SNR available for image construction depends in part on flux coupling between the patient and the coil. Current NMR imaging systems are limited to thick slice (1 cm) medium resolution images of the body due in part to rf coil inefficiency. The SNR requirements for thin section (0.6 cm) images with increased in-plane resolution may require more than 100% greater SNR to obtain images with useful diagnostic content. Numerous RF coil designs have been suggested in the literature including saddle coils, half saddles, birdcage resonators and various distributed phase designs. Due to the size of the human body these coils have tended to be very large. Unfortunately, large coils do not have high flux coupling to any particular area of interest. Instead they have a moderate coupling to the entire body. While this may be acceptable for randomly imaging the body, it is a very inefficient means for imaging a particular organ of interest. Thus large body rf coils are available for NMR imaging of the entire torso which lack thin slice, high resolution capability in general.

SUMMARY OF THE INVENTION

Accordingly, it is an object of the invention to provide an RF receiver coil structure for NMR imaging of the human torso, which provides much higher flux coupling than previous receiver coils to permit high quality imaging of the human heart.

Briefly, in accordance with the invention there is provided a receiver coil structure for NMR imaging of cardiac and thoraco-abdominal regions of a human body, the coil structure including a coil of generally solenoidal geometry having two turns separated by an inter-element gap. The inter-element gap is sufficiently large to accommodate an average human torso at the chest level (e.g. 25 cm). The turns are cross coupled by a pair of crossed diagonal elements.

The total body volume enclosed by the majority of the lines of flux from this particular coil structure is only slightly larger than the heart itself, yielding a very high flux density in the area of the heart.

In order to minimize coil resistance, which is a fundamental consideration, the coil is formed of a material which has good electrical conductivity, such as high purity copper. The shape of the conductor is important since the "skin effect" at the frequencies employed concentrates current at the surface of a conductor, and the sharp edges are to be avoided since they tend to concentrate magnetic flux, and degrade the homogeneity of the field.

The coil of the invention employs a tubular shaped conductor, having a tubular diameter (outside diameter) of approximately ½ inch. Such a tubular conductor maximizes the amount of cross sectional area available for conduction, efficiently uses conductor material, and provides more homogeneous near magnetic fields due to the larger turning radius and gradual flux change.

While high purity copper tubing has been found to be acceptable, it may be desirable to provide a silver plating for even greater conductivity.

The coil has terminal ends in one of its diagonal elements, and the coil structure further includes a component unit located where the diagonal elements cross. The component unit includes resonating capacitor electrically coupled to the coil terminal ends.

The same geometry may be employed in a multi-turn structure, where preferably one-half of the total number of turns are positioned above the patient, and the other half below the patient.

Thus, the present invention provides a receiver coil geometry which maximizes flux coupling for high quality NMR images. The invention may be viewed as obtaining the benefits of high sensitivity surface coils, while preserving deep penetration and image homogeneity characteristic of volume coils.

BRIEF DESCRIPTION OF THE DRAWINGS

While the novel features of the invention are set forth with particularity in the appended claims, the invention, both as to organization and content, will be better understood and appreciated from the following detailed description, taken in conjunction with the drawings in which:

DETAILED DESCRIPTION

Figure 1:
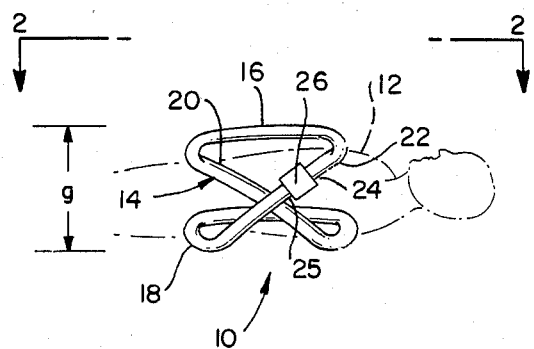
FIG. 1 is an elevational side view depicting a receiver coil structure of the invention applied to the torso of a patient.
Figure 2:
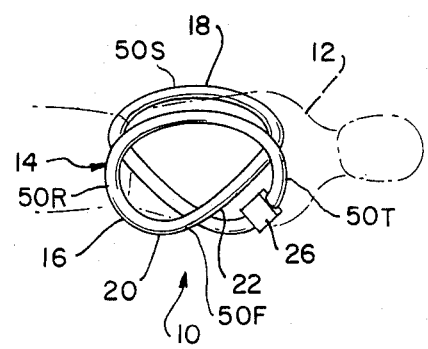
FIG. 2 is a plan view taken along line 2—2 of FIG. 1.

With reference first to FIGS. 1 and 2, a receiver coil structure 10 in accordance with the invention is shown applied to a human torso 12. It will be understood that the receiver coil structure 10 and the torso 12 are within an NMR imaging system, not otherwise depicted.

The coil structure 10 more particularly comprises a coil 14 of generally solenoidal geometry having two turns 16 and 18 separated by an interelement gap g sufficiently large to accommodate the human torso 12. The turns 16 and 18 are cross coupled by a pair of crossed diagonal elements 20 and 22.

As noted above, the coil 14 of the invention, including the turns 16 and 18, as well as the crossed diagonal elements 20 and 22, is formed of a tubular conductor, having a tubular diameter (outside diameter) of approximately ½ inch. Such a tubular conductor maximizes the amount of cross sectional area available for conduction, efficiently uses conductor material, and provides more homogeneous near magnetic fields due to the larger turning radius and gradual flux change. While high purity copper tubing has been found to be acceptable, it may be desirable to provide a silver plating for even greater conductivity.

Due to the importance of size in maintaining coil efficiency, it is preferable to provide a set of receiver coil structures in accordance with the invention appropriately sized for small, medium and large patients.

The two-turn coil 14 illustrated is representative only, as a multi-turn coil of the same general geometry may be provided. Preferably, in a multi-turn version there are an even number of turns, with the same number of turns above the patient's body (corresponding to the position of the single turn 16) as are below the patient's body (corresponding to the position of the turn 18), and an appropriate number of crossed diagonal elements.

The coil 14 has terminal ends 24 and 25 in one of the diagonal elements, for example the diagonal element 22. A component unit 26 is generally located where the diagonal elements 20 and 22 cross and bridges the terminal ends 24 and 25 as shown in FIG. 1.

As shown in FIG. 2, the coil structure 10 may be considered as having first, second, third and fourth sides respectively designated 50F, 50S, 50T, and 50R. As will be readily appreciated by considering FIG. 2 in conjunction with FIG. 1, a first sideways direction extending between the first and second sides 50F and 50S is perpendicular to the gap direction (the gap direction being indicated by the small g arrowheads in FIG. 1). In similar fashion, a second sideways direction extending between the third and fourth sides 50T and 50R is perpendicular to the gap direction and, additionally, is perpendicular to the first sideways direction. As will be appreciated from FIGS. 1 and 2 taken in combination, the gap between the turns 16 and 18 is completely open on the second, third, and fourth sides 50S, 50T, and 50R, whereas the first side 50F is at least partially bounded by the diagonal elements 20 and 22.

Figure 3:
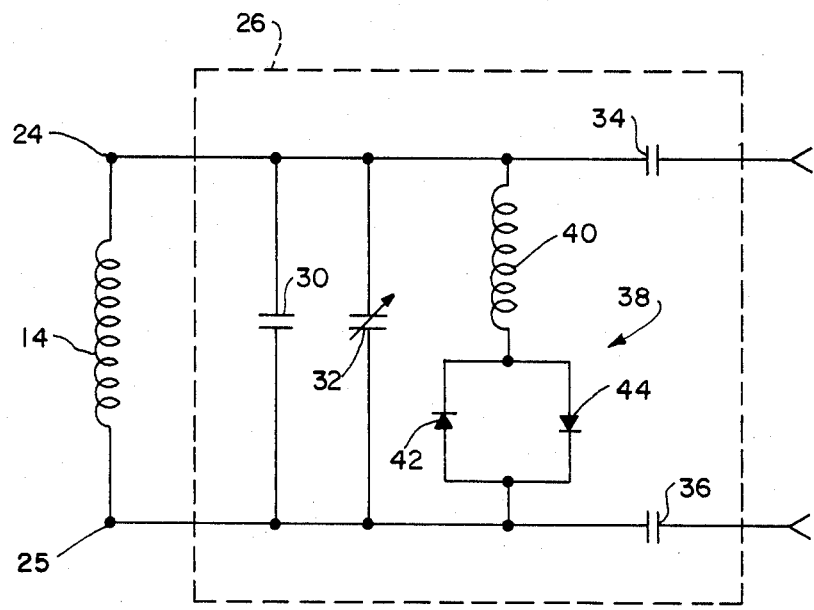
FIG. 3 is an electrical schematic diagram depicting electrical components within a component unit.

With reference to FIG. 3, the component unit 26 more particularly may be seem to include a capacitor 30 electrically connected to the coil terminal ends 24 and 25 to provide a resonant circuit. Capacitor 30 is fixed, and a variable capacitor 32 of smaller capacitance value (e.g. 6–67 pf) is connected in parallel to provide fine tuning. Impedance matching is provided by capacitors 34 and 36, which terminate in a suitable connector, such as a BNC connector. The output impedance is 50 Ohms. In order to minimize transmitter feed through, a suppression network 38 is included, comprising an inductor 40 having an inductance of approximately 10 microhenrys in series with pair of paralleled back-to-back diodes 42 and 44. It will be appreciated that the circuitry within the component unit 26 comprises a balanced matching network, which minimizes the dielectric losses inherent in imaging of the human body.

0.174 G/cm=Head gradients (FOV=21 cm)
0.139 G/cm=Head gradients (FOV=28 cm)
0.086 G/cm=Body gradients (FOV=36 cm)
0.069 G/cm=Body gradients (FOV=48 cm)

When FOV is the Field of View. Slice thickness ranged from 4.5 to 10 mm. An imaging goal was to select technique factors which provided maximal spatial resolution without seriously reducing SNR. Cardiac imaging was facilitated by ECG gating. Spin echo acquisition employing 128 or 192 steps and 6–10 mm thick slices were used for caridac imaging. Using four signal averages, each multi-slice series took 6–10 minutes. Body imaging was performed using various sequences with 6 and 2 signal averages, and slice thickness of 6–10 mm.

A significant improvement in image quality was shown to be possible using the inventive coil (TABLE I). An increase in gradient field strength was possible because of increased SNR. Thus the cardiac and body imaging was imaged at similar resolution used for central nervous system (CNS) and extremity work. The maximum inplane resolution in this mode was 1.4×0.9 mm. Use of the coil of the invention in body imaging showed improved signal uniformity across the field while maintaining the high image resolution usually achievable only with surface coils. Cardiac imaging was improved markedly with increases in spatial resolution and increased signal-to-noise. The improvements in cardiac imaging may be attributed to location of the sensitive elements in much closer proximity to the heart than the conventional body coil and exclusion of arms from the field. The coil also facilitates improved imaging of superficial structures such as the lumbar spine when lordosis or thick body wall separates the target area from the coil.

TABLE I

| COIL | TEQ = C2TEA | | | | | |
|---|---|---|---|---|---|---|
| | 500/30 | SS = 5 | NSL = 1 | SLT = 1 | | |
| | | MAG 25% BODY GRAD | | | | |
| | | | | | SNR | |
| | $\bar{X}_s$-PECT | $\bar{X}_s$-MOYC | $\bar{X}_n$ | $SD_n$ | PECT | MYOC |
| COMMERCIAL BODY COIL | 44.8 | 77.9 | 9.1 | 4.6 | 7.8 | 14.9 |
| DOUBLE LOOP COIL | 136.1 | 174 | 9.9 | 4.0 | 31.6 | 41.0 |
| | | | | Improvement: | +400% | +275% |

Figure 4:
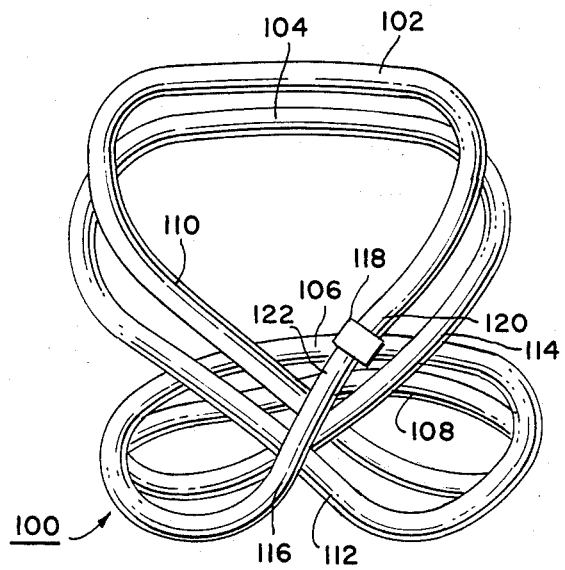
FIG. 4 is an elevation view of a multiple turn receiver coil structure of the present invention.

As shown in FIG. 4, a multiple turn version 100 of the present invention includes two upper turns 102 and 104 and two lower turns 106 and 108. As mentioned above, an appropriate number of crossed diagonal elements are used. The diagonal elements are shown in the drawing as diagonal elements 110, 112, 114, and 116. The component unit 118 is mounted on the diagonal element 116 as shown. As with the embodiment of FIGS. 1 and 2, the component unit 118 is disposed at terminal ends 120 and 122.

EXPERIMENTAL RESULTS

Image quality was assessed using a standard fluid filled phantom, as well as in fifty patients who underwent clinically indicated NMR imaging. All patients were imaged using one of two versions of the double loop coil of the invention. Ten of these patients were also imaged with standard surface coils or volume coils. Images were obtained using the following gradient strengths:

Where
$\bar{X}_s$ is mean signal
$\bar{X}_n$ is mean noise
$SD_n$ is standard deviation noise
PECT refers to the pectoral region and
MYOC refers to the myocardial region.

While specific embodiments of the invention have been illustrated and described herein, it is realized that modifications and changes will occur to those skilled in the art. It is therefore to be understood that the appended claims are intended to cover all such modifications and changes as fall within the true spirit and scope of the invention.

What is claimed is:

1. An NMR receiver coil structure for NMR imaging of cardiac and thoraco-abdominal regions of a human body, said coil structure comprising:
   a coil, adapted to receive NMR signals, having at least two turns separated by a gap extending in a gap direction, said gap being sufficiently large to accommodate a human torso, said turns being cross coupled by crossed diagonal elements;

said coil being formed of a conductor which is tubular and of a material which has good electrical conductivity; and a component unit located where said diagonal elements cross, said coil having terminal ends in one of said diagonal elements, said component unit being mounted to bridge said terminal ends, and said component unit including a capacitor electrically connected to the coil terminal ends to form a parallel resonant circuit, and wherein said crossed diagonal elements are located on a first side of said coil structure, said gap has a maximum at a second side of said coil structure opposite said first side of said coil structure, said coil structure has a third side and a fourth side, said gap direction being perpendicular to a first sideways direction extending between said first and second sides and being perpendicular to a second sideways direction extending between said third and fourth sides, said first sideways direction being perpendicular to said second sideways direction, and wherein said gap is completely open on said second, third, and fourth sides of said coil structure.

2. An NMR receiver coil structure in accordance with claim 1, wherein said coil is formed of tubing having an outside diameter of approximately ½ inch.

3. An NMR receiver coil structure in accordance with claim 2, wherein said coil comprises high purity copper tubing.

4. An NMR receiver coil structure in accordance with claim 3, wherein said coil comprises more than two turns.

5. An NMR receiver coil structure in accordance with claim 2, wherein said coil comprises more than two turns.

6. An NMR receiver coil structure in accordance with claim 1, wherein said coil comprises more than two turns.

* * * * *